(12) United States Patent
Zaal et al.

(10) Patent No.: US 7,746,447 B2
(45) Date of Patent: Jun. 29, 2010

(54) LITHOGRAPHIC APPARATUS, DEVICE MANUFACTURING METHOD AND METHOD OF CALIBRATING A LITHOGRAPHIC APPARATUS

(75) Inventors: Koen Jacobus Johannes Maria Zaal, Eindhoven (NL); Johannes Henricus Wilhelmus Jacobs, Eindhoven (NL); Erik Roelof Loopstra, Heeze (NL); Joost Jeroen Ottens, Veldhoven (NL); Frederik Eduard De Jong, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 857 days.

(21) Appl. No.: 11/314,157

(22) Filed: Dec. 22, 2005

(65) Prior Publication Data

US 2007/0146664 A1 Jun. 28, 2007

(51) Int. Cl.
*G03B 27/42* (2006.01)
*G03B 27/52* (2006.01)
*G03B 27/58* (2006.01)

(52) U.S. Cl. .............. 355/53; 355/30; 355/72
(58) Field of Classification Search ............... 355/30, 355/53, 72–76
See application file for complete search history.

(56) References Cited

U.S. PATENT DOCUMENTS

| 4,509,852 | A | | 4/1985 | Tabarelli et al. |
| 5,063,582 | A | * | 11/1991 | Mori et al. ............... 378/34 |
| 5,577,552 | A | * | 11/1996 | Ebinuma et al. ........... 165/296 |
| 6,226,073 | B1 | * | 5/2001 | Emoto ..................... 355/53 |
| 2005/0088634 | A1 | | 4/2005 | Kosugi et al. |
| 2007/0070324 | A1 | * | 3/2007 | Kuit et al. ................. 355/72 |
| 2008/0106707 | A1 | | 5/2008 | Kobayashi et al. |

FOREIGN PATENT DOCUMENTS

| JP | 2005-142283 A | 6/2005 |
| JP | 2005-252247 A | 9/2005 |
| WO | WO 99/49504 | 9/1999 |
| WO | WO 03/079418 | 9/2003 |

OTHER PUBLICATIONS

English Translation of the Notice of Reasons for Rejection as issued for JP Patent Application No. 2006-338021, dated Nov. 12, 2009.

* cited by examiner

*Primary Examiner*—Hung Henry Nguyen
(74) *Attorney, Agent, or Firm*—Pillsbury Winthrop Shaw Pittman LLP

(57) ABSTRACT

An immersion lithographic apparatus has a plurality of substrate holders arranged to hold substrates, each substrate holder having a conduit therein for passing a temperature control fluid. The thermal responses of the different substrate holders are calibrated and flow rates calculated and used so that all the holders return to a predetermined temperature in the same time.

8 Claims, 5 Drawing Sheets ic apparatus, a device manufacturing method and method of calibrating a lithographic apparatus.

LITHOGRAPHIC APPARATUS, DEVICE MANUFACTURING METHOD AND METHOD OF CALIBRATING A LITHOGRAPHIC APPARATUS

FIELD

The present invention relates to a lithographic apparatus, a method for manufacturing a device, and a method of calibrating a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as enabling the use of a larger effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that needs to be accelerated during a scanning exposure. This requires additional or more powerful motors, and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2, the liquid is supplied along the direction of movement of the substrate relative to the final element, though this does not need to be the case. Various orientations and numbers of in- and out-lets positioned around the final element are possible. One example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably, the seal is a contactless seal such as a gas seal. Such as system with a gas seal is disclosed in European Patent Application No. 03252955.4, which is hereby incorporated in its entirety by reference.

In European Patent Application No. 03257072.3, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

One problem with immersion lithography apparatus is that evaporation of residual immersion liquid after exposures cools the wafer and hence may cause thermal contraction of the wafer. This may lead to overlay errors and can be a particular problem when water is used as the immersion liquid because water has a high latent heat of evaporation and evaporates readily in the warm, dry atmosphere that is usually in a clean room. To address this problem, a temperature control system can be provided. In an example of such a system, a temperature control fluid, e.g. water, at the desired temperature of the substrate is circulated through channels in the substrate holder, e.g. a pimple plate or burl table.

However, due to the poor thermal conductivity of the substrate holder and the substrate, the poor thermal contact between the substrate holder and the substrate and the small temperature differences involved, it takes an undesirably long time to bring the substrate to thermal equilibrium at the desired temperature. Also, because of differences in the thermal characteristics of the substrate holders the time taken to reach thermal equilibrium can be unpredictable necessitating the provision of additional time for thermal settling. As is well known, any reduction of throughput in a lithographic apparatus, such as caused by increased settling times, increases the cost of ownership and is therefore undesirable.

SUMMARY

It is desirable to provide an improved temperature conditioning system for the substrate in immersion lithography apparatus.

According to an aspect of the invention, there is provided a lithographic apparatus for projecting an image of a desired pattern through a liquid onto substrates, the apparatus comprising:

a plurality of substrate holders, each substrate holder being arranged to hold at least one substrate and having a conduit therein for passing a temperature control fluid;

a fluid supply system arranged to supply temperature control fluid substantially at a predetermined temperature; and a flow controller arranged to control the rates of flow of temperature control fluid in each of the substrate holders so that the flow rate in a first one of the substrate holders is different from the flow rate in a second one of the substrate holders.

According to a further aspect of the invention, there is provided a lithographic apparatus for projecting an image of a desired pattern through a liquid onto a substrate the apparatus comprising:

a substrate holder arranged to hold a substrate, the substrate holder having a conduit therein for passing a temperature control fluid;

a fluid supply system arranged to supply temperature control fluid substantially at a predetermined temperature;

a heater arranged to heat fluid supplied by the fluid supply system before it reaches the conduit; and a controller arranged to control the heater to heat the temperature control fluid in the period between completion of exposures on a first substrate and loading of a second substrate onto the substrate holder.

According to a further aspect of the invention, there is provided a device manufacturing method in which an image of a desired pattern is projected through a liquid onto a substrate using a lithographic apparatus having a plurality of substrate holders, the method comprising:

passing a temperature control fluid substantially at a predetermined temperature through a conduit in each of the substrate holders during exposure of a substrate held on the respective substrate holder, the flow rate of the temperature control fluid in at least one of the substrate holders being different from the flow rate in another of the substrate holders.

According to a further aspect of the invention, there is provided a method of calibrating a lithographic apparatus having a plurality of substrate holders arranged to hold substrates, each substrate holder having a conduit therein for passing a temperature control fluid, the method comprising:

measuring the thermal response of each substrate holder; and determining a flow rate of temperature control fluid for each substrate holder such that when temperature control fluid is passed through each substrate holder at the respective determined flow rate, each substrate holder returns to a predetermined temperature after a given thermal load in substantially the same time.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the Figures, corresponding reference symbols indicate corresponding parts.

DETAILED DESCRIPTION

Figure 1:
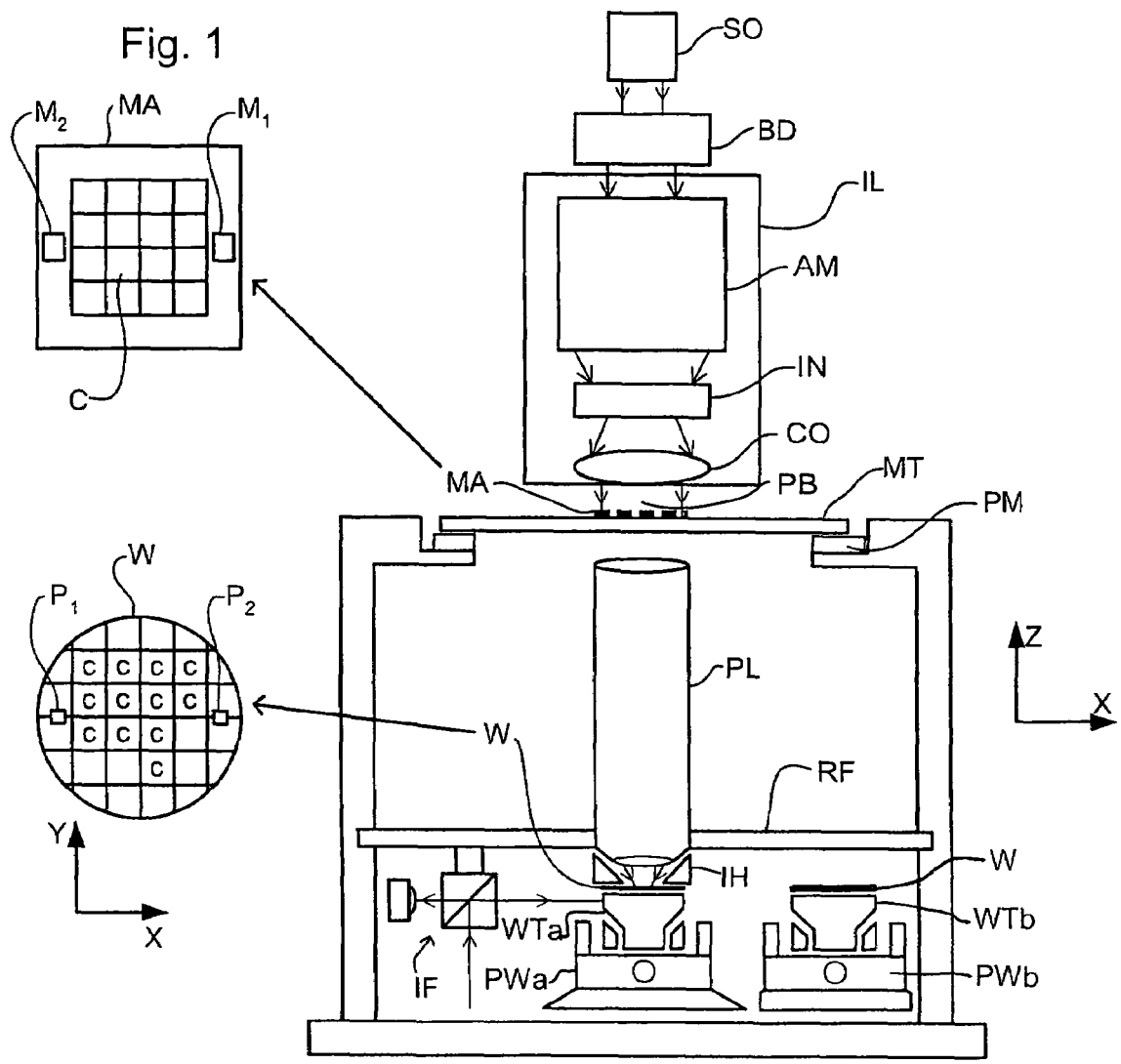
FIG. 1 depicts a lithographic apparatus according to an embodiment of the invention.
Figure 2:
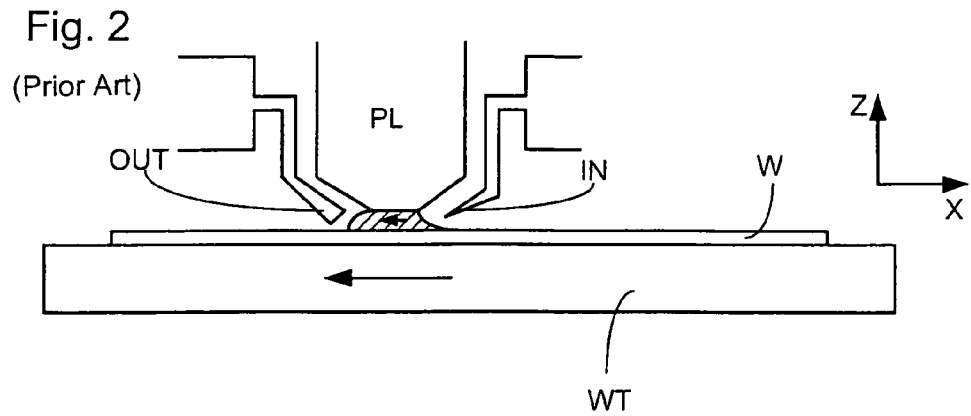
FIGS. 2 and 3 depict a liquid supply system used in a prior art lithographic projection apparatus.
Figure 3:
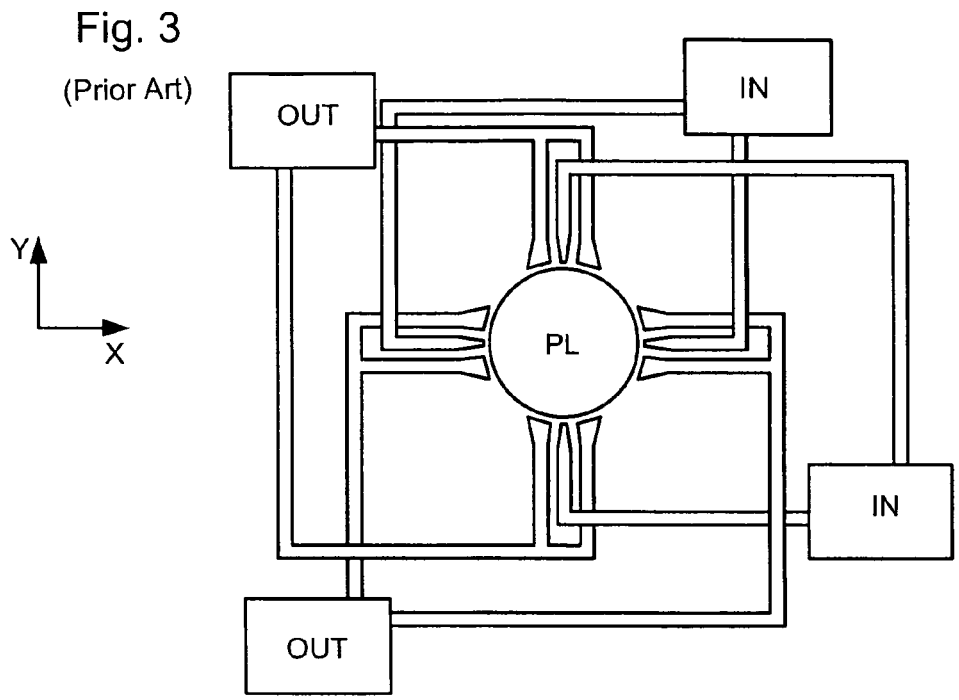
Figure 4:
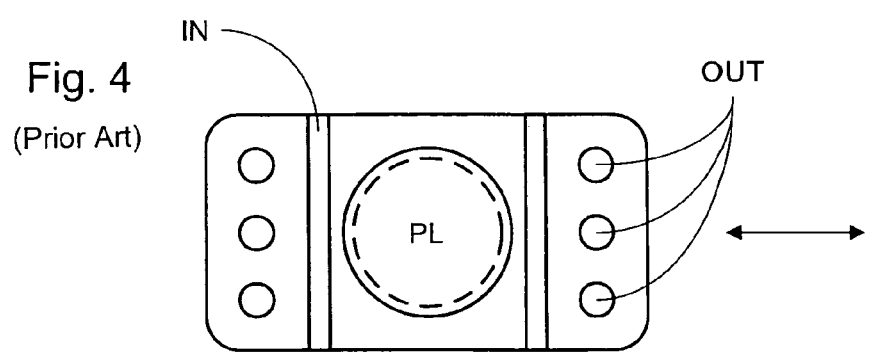
FIG. 4 depicts a liquid supply system according to another prior art lithographic projection apparatus.
Figure 4:
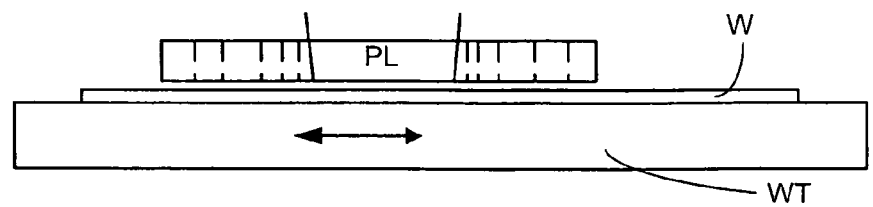

FIG. 1 schematically depicts a lithographic apparatus according to one embodiment of the invention. The apparatus comprises an illumination system (illuminator) IL configured to condition a radiation beam PB (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WTa constructed to hold a substrate (e.g. a resist-coated wafer) W and connected to a second positioner PWa configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W. The apparatus also includes a second substrate table (e.g. wafer table) WTb constructed to hold a substrate (e.g. a resist-coated wafer) W and connected to a third positioner PWb.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PWa and position sensor IF (e.g. an interferometric device, linear encoder or capacitive sensor), the substrate table WTa can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PWa. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa are kept essentially stationary, while an entire pattern imparted to the radiation beam is projected onto a target portion C at one time (i.e. a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa are scanned synchronously while a pattern imparted to the radiation beam is projected onto a target portion C (i.e. a single dynamic exposure). The velocity and direction of the substrate table WTa relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
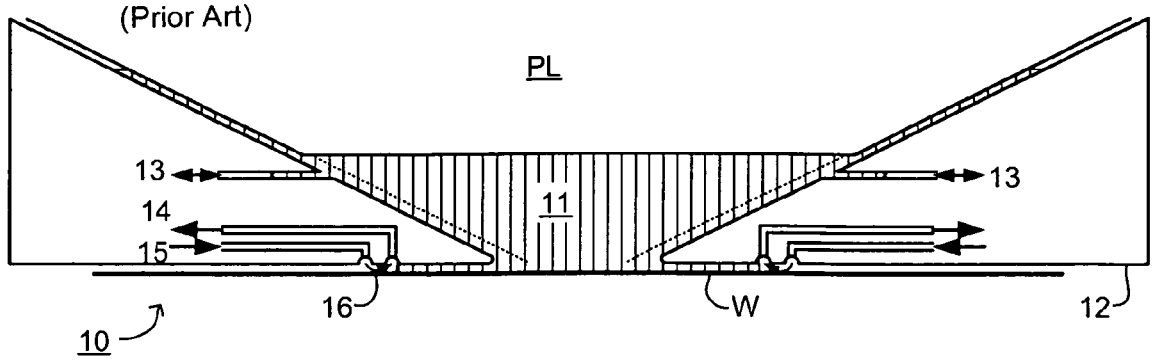
FIG. 5 depicts a liquid supply system according to another prior art lithographic projection apparatus.

As shown in FIG. 5, a liquid supply system 10 is used to supply liquid to the space between the final element of the projection system and the substrate. A reservoir 11 forms a contactless seal to the substrate W around the image field of the projection system PL so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir 11 by a gas seal 16 between the bottom of the seal member 12 and the surface of the substrate W. The gas seal is formed by gas, e.g. air or synthetic air but preferably N2 or another inert gas, provided under pressure via inlet 15 to the gap between seal member 12 and substrate W and extracted via first outlet 14. The overpressure on the gas inlet 15, vacuum level on the first outlet 14 and geometry of the gap are arranged so that there is a high-velocity air flow inwards that confines the liquid.

In a lithographic apparatus, the substrate W is commonly placed upon a substrate holder WH, also referred to as a pimple plate or burl table, which sits in a recess, often referred to as a pot hole, in the upper surface of the substrate tables Wta, WTb. In an embodiment of the invention, to control the temperature of the substrate a temperature control system is provided. By this system, a temperature control fluid, e.g. water, is circulated through channels in the substrate holder. The fluid is maintained very precisely at the temperature at which it is desired to maintain the substrate—the target temperature. However, due to the thermal mass and conductivities of the substrate and holder, there is a delay between any cooling applied to the substrate, e.g. due to contact with the immersion liquid and liquid supply system or by evaporation of residual immersion liquid, and the substrate returning to the target temperature. This delay may cause wafer deformation due to thermal expansion and contraction and can lead to overlay errors. However, if the wafer deformation is predictable and consistent, it affects only machine-to-machine overlay performance, and not single machine overlay performance, the specifications for which are more strict.

The inventors have determined that there is a small but significant difference between the thermal responses of different substrate holders. Such a difference can lead to a single machine overlay error in a dual-stage immersion lithography apparatus, because such an apparatus has two substrate holders—one for each wafer table. To eliminate this difference, it is proposed according to an embodiment of the invention to calibrate the thermal responses of the two substrate holders in a dual-stage immersion lithography apparatus. A calibration system as depicted in FIGS. 6 and 7 and a method as depicted in FIG. 9 may be used for this purpose.

Figure 6:
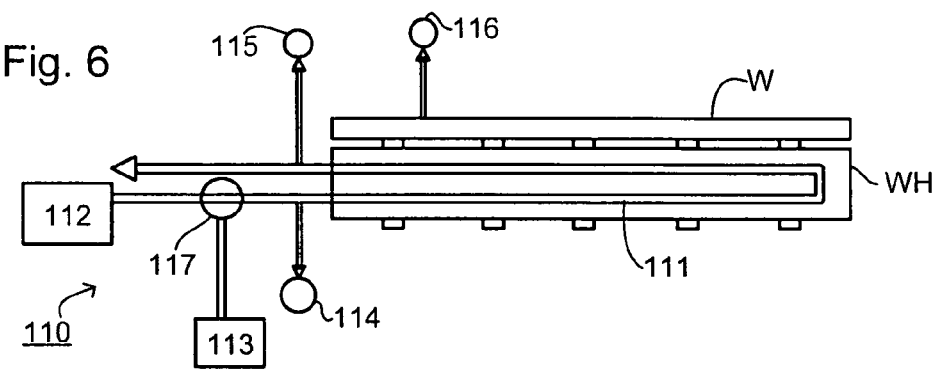
FIGS. 6 and 7 depict a system for measuring the thermal characteristics of a substrate holder.
Figure 7:
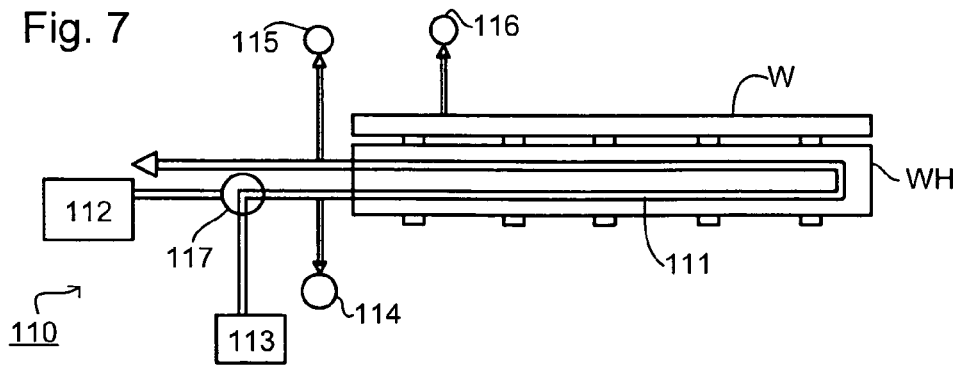

The calibration system 10 shown in FIGS. 6 and 7 has two water supplies 112 and 113 which supply water at a standard temperature T1, which may be equal to the target temperature, and an elevated temperature T2. In other words T2 is greater than T1. The temperature control channels 111 in the substrate holder WH can be supplied with water from one or other of the supplies by changing over valve 17. Temperature sensors 114 and 115 measure the temperature of the ingoing and outgoing water supplies, respectively, while temperature sensor 116 measures the temperature of a substrate W held on the substrate holder WH.

Figure 8:
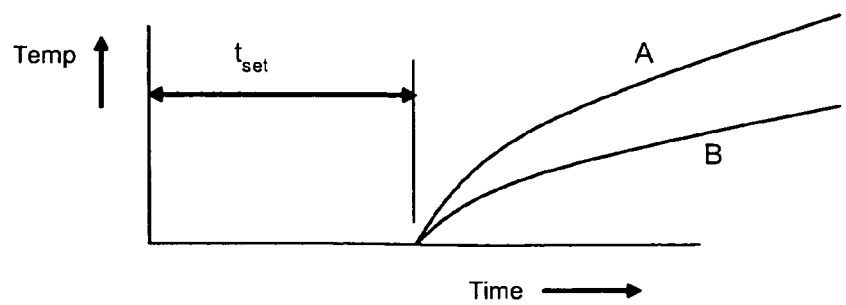
FIG. 8 depicts the thermal responses of a substrate holder at different flow rates of temperature control fluid.
Figure 9:
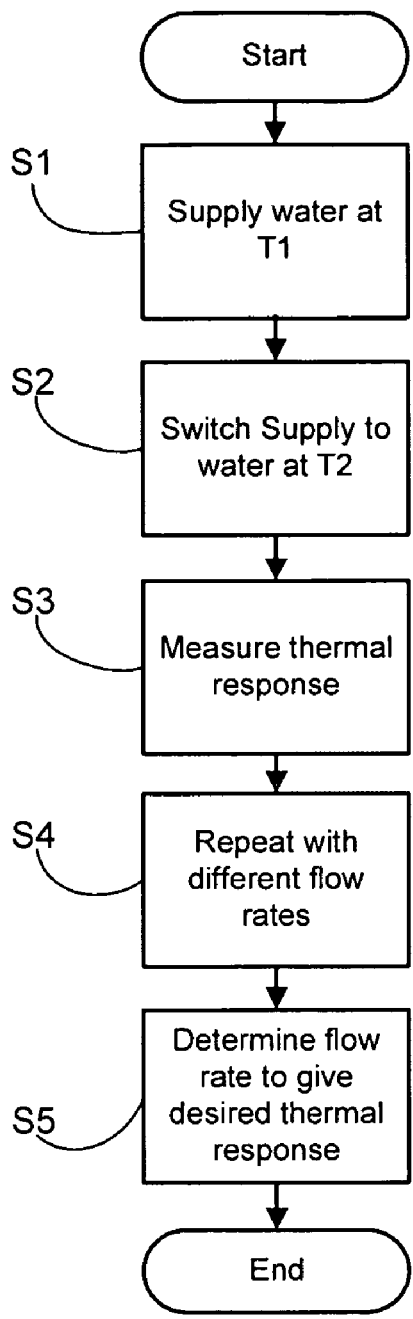
FIG. 9 depicts a calibration method according to an embodiment of the present invention.

As shown in FIG. 9, at step S1 water from supply 112 is supplied to the channels 110 for a time $t_{set}$ sufficient for the substrate and substrate holder to reach thermal equilibrium at temperature T1. At step S2, valve 117 is changed over so that water from supply 113, which is at temperature T2, is supplied to the channels 111. The thermal response of the substrate holder is then measured by recording the temperature of the outgoing water and/or the substrate W over time using temperature sensors 115 and 116, at step S3. Steps S1 to S3 are then repeated in step S4 a number of times, with different flow rates of the water at temperature T2. From the resulting data, the thermal response of the substrate holder at different flow rates can be determined. FIG. 8 shows an example of the thermal response of a holder at high and low flow rates—denoted by A and B, respectively.

The measurements described above are preferably carried out in a stable thermal environment, for example an open box, to prevent disturbances by air currents, to ensure valid comparisons over time can be made.

Once the thermal responses at different flow rates have been determined for the two substrate holders of a dual stage lithographic apparatus have been determined, appropriate flow rates for each substrate holder to provide a consistent or matched thermal response can be determined. This may involve interpolation between measurements taken at spaced apart flow rates. It is preferable that the flow rate be determined to match a standard thermal response curve. The inventors have determined that variations in the flow rate of ±20% (i.e. within 20%) of a norm can accommodate most variations experienced in the thermal resistance of a substrate table. A normal flow rate may be about 0.31/min.

Figure 10:
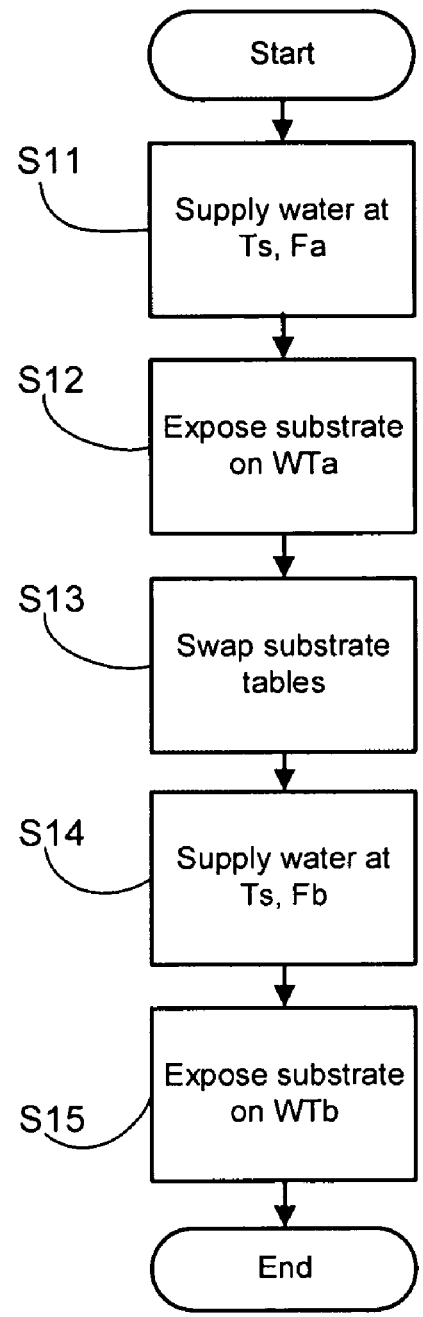
FIG. 10 depicts steps in a device manufacturing method according to another embodiment of the present invention.

As shown in FIG. 10, once the appropriate flow rates have been determined, exposure of substrates on two substrate tables WTa, WTb proceeds as follows:

S11: supply water to substrate table WTa at the standard temperature Ts and flow rate Fa;

S12: expose the substrate on substrate table WTa;

S13: swap substrate tables between exposure and measurement stations;

S14: supply water to substrate table WTb at the standard temperature Ts and flow rate Fb;

S15: expose substrate on substrate table WTb.

The standard temperature Ts is the temperature at which it is desired to expose substrates and may for example be about 22.0° C. or about 23.0° C. A tolerance of about ±0.1° C. in the substrate temperature may be permitted, and to keep within this tolerance, the water is preferably maintained within about 0.02 or about 0.05° C. of the standard temperature.

An additional problem that can occur in immersion lithography apparatus is a variation in overlay performance between substrates in a batch or lot. This can occur because of the time taken for the substrate table to reach thermal equilibrium at the beginning of a series of exposures. If there is a significant pause in operation at the beginning of a lot, e.g. because of time taken to change masks or load a new set of substrates, the time taken for the substrate to reach thermal equilibrium can be as long as taken to expose the whole of a substrate. To wait that long before starting exposures is an undesirable loss of throughput but otherwise the overlay performance of the first substrate of a batch is poorer than the rest and may lead to a loss of yield. The time taken to reach thermal equilibrium is dictated by the requirement to maintain the temperature control fluid within about 0.02 or about 0.05° C. of the target temperature.

In most cases, the temperature variation is a drop in temperature caused by the cooling effect of evaporation of residual immersion fluid, especially water, on the substrate between the end of exposures and the unloading of the substrate. Accordingly, in an embodiment of the invention, energy in the form of heat is supplied to the substrate holder between the end of exposures on a first substrate and the loading of the next substrate.

Figure 11:
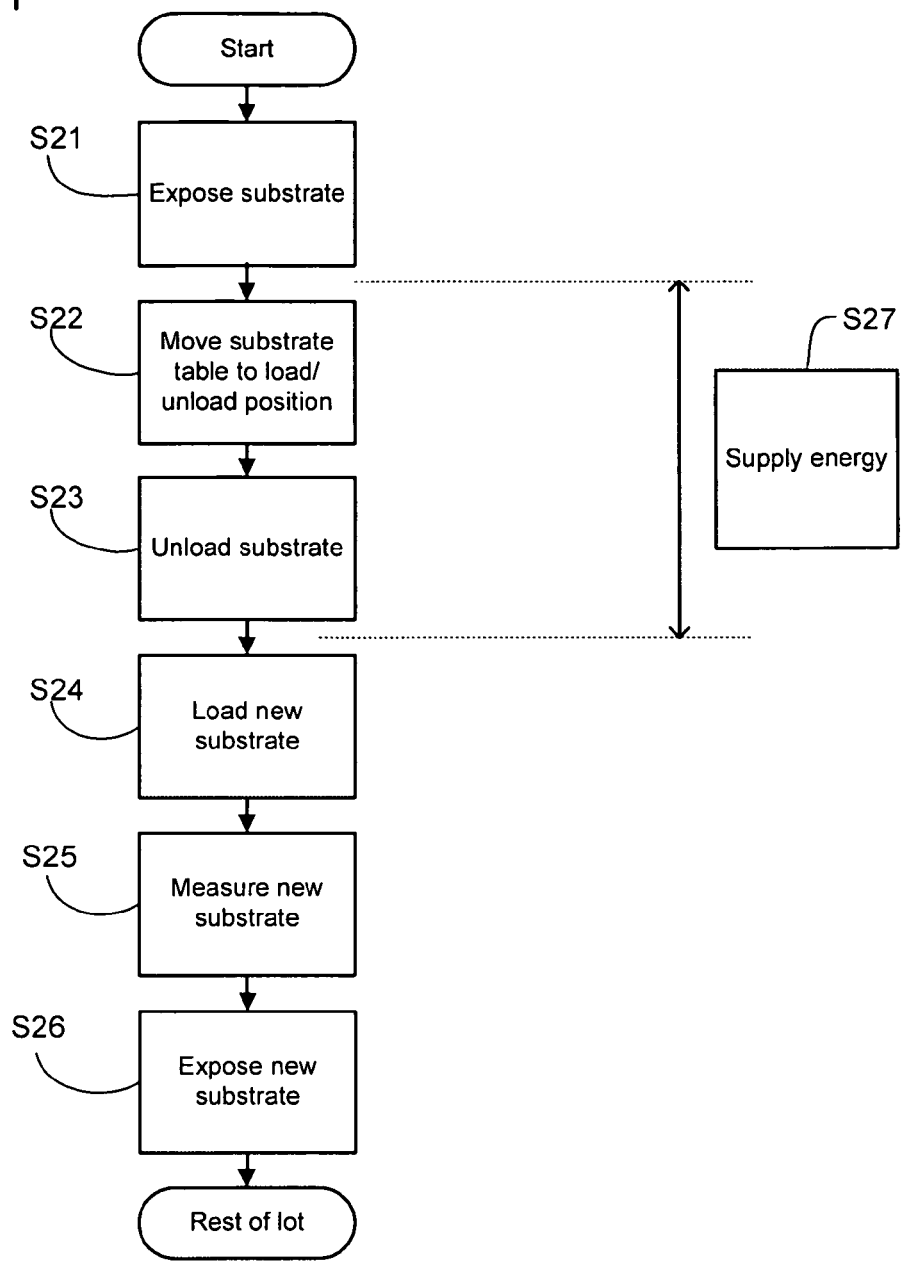
FIG. 11 depicts steps in a device manufacturing method according to another embodiment of the present invention.

The sequence of steps is shown in more detail in FIG. 11. At S21, after exposures on the last substrate of a first lot are complete, the substrate table is moved to a load/unload position at S22, and the exposed substrate is unloaded at S23. The first, unexposed substrate of a new lot is then loaded on to the substrate table at S24, and necessary measurements—e.g. alignment steps or taking a height map—are made at S25, and the new substrate is exposed at S26. To avoid the first substrate effect mentioned above, in an embodiment of the invention, extra energy in the form of heat is supplied to the substrate holder WH between the completion of the exposures of the last substrate of a lot and the loading of the first substrate of the new lot.

Figure 12:
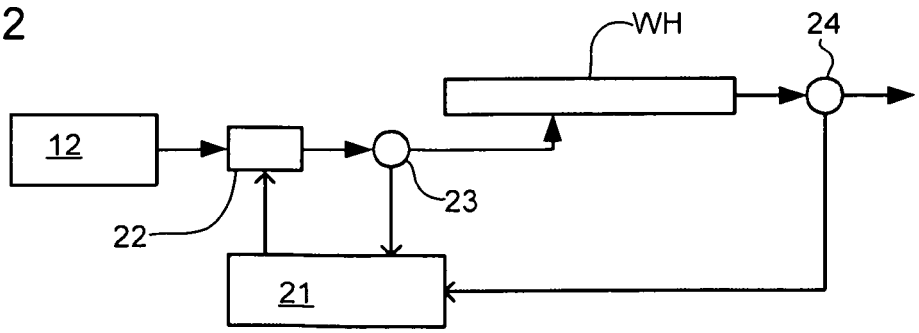
FIG. 12 depicts a temperature control system according to another embodiment of the present invention.

An arrangement to effect this is shown in FIG. 12. Between the temperature control fluid supply 12, which supplies fluid at a very constant temperature equal to the target temperature, and the substrate holder a heater 22 is provided. This heater 22 is controlled by controller 21, which is also connected to temperature sensors 23 and 24, which measure the temperature of the temperature control fluid going into and out of the substrate holder respectively. The heater 22 may be any conventional form of heater, e.g. an electrical resistance heater, that can supply a controlled amount of energy in the range of about 500 to about 1000 J at a peak power of about 50-500 W. In many cases, the exact amount of energy to be supplied is not critical, and an empirically derived predetermined amount of energy can be used. Alternatively, it is possible to calculate on case-by-case basis the amount of energy needed, taking into account relevant variables such as the temperature of the substrate, e.g. as given by the temperature of the outgoing control fluid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A lithographic apparatus for projecting an image of a desired pattern through a liquid onto substrates, the apparatus comprising:
    a plurality of substrate holders, each substrate holder being arranged to hold at least one substrate and having a conduit therein for passing a temperature control fluid;
    a fluid supply system arranged to supply temperature control fluid substantially at a predetermined temperature;
    a flow controller arranged to control the rates of flow of temperature control fluid in each of the substrate holders so that the flow rate in a first one of the substrate holders is different from the flow rate in a second one of the substrate holders; and
    a temperature control system arranged between the fluid supply system and the substrate holders when a respective substrate holder is in position to hold the substrate during projection of the image through the liquid, the temperature control system comprising
        a heater arranged to heat the temperature control fluid;
        a first temperature sensor arranged to measure the temperature of the temperature control fluid entering the respective substrate holder,
        a second temperature sensor arranged to measure the temperature of the temperature control fluid exiting the respective substrate holder, and
        a temperature controller arranged to receive temperature measurements from the first temperature sensor and the second temperature sensor and to control the heater based on the temperature measurements.

2. An apparatus according to claim 1, wherein the flow rate in the first substrate holder is within 20% of the flow rate in the second substrate holder.

3. An apparatus according to claim 1, wherein the flow rates in the plurality of substrate holders are such that the times taken for each substrate holder to reach the predetermined temperature are substantially equal.

4. An apparatus according to claim 1, wherein the predetermined temperature is about 22° C.

5. An apparatus according to claim 1, wherein the predetermined temperature is about 23° C.

6. An apparatus according to claim 1, wherein the fluid supply system is arranged to supply temperature control fluid at a temperature within about 0.02° C. of the predetermined temperature.

7. An apparatus according to claim 1, wherein the fluid supply system is arranged to supply temperature control fluid at a temperature within about 0.05° C. of the predetermined temperature.

8. A device manufacturing method in which an image of a desired pattern is projected through a liquid onto a substrate using a lithographic apparatus having a plurality of substrate holders, the method comprising:
    passing a temperature control fluid substantially at a predetermined temperature through a conduit in each of the substrate holders during exposure of a substrate held on the respective substrate holder,
    the flow rate of the temperature control fluid in at least one of the substrate holders being different from the flow rate in another of the substrate holders; and
    supplying heat to the respective substrate holder between completion of exposure of a last substrate of a lot and loading of a first substrate of a new lot.

* * * * *